United States Patent [19]

Quinn et al.

[11] 3,975,220

[45] Aug. 17, 1976

[54] DIFFUSION CONTROL FOR CONTROLLING PARASITIC CAPACITOR EFFECTS IN SINGLE FET STRUCTURE ARRAYS

[75] Inventors: Robert Michael Quinn; William John Schuele, both of South Burlington; Richard Alan Unis, Essex Junction, all of V.I.

[73] Assignee: International Business Machines Corporation, Armonk, N.Y.

[22] Filed: Sept. 5, 1975

[21] Appl. No.: 610,722

[52] U.S. Cl............................. 148/187; 29/571; 29/578; 29/580; 148/188; 357/23; 357/41; 357/51; 357/53
[51] Int. Cl.²............... H01L 21/225; H01L 29/78
[58] Field of Search............. 148/187, 188; 357/23, 357/41, 51, 53; 29/571, 578, 580

[56] References Cited
UNITED STATES PATENTS

| | | | |
|---|---|---|---|
| 3,574,010 | 4/1971 | Brown............................. | 148/188 X |
| 3,604,107 | 9/1971 | Fassett............................ | 29/571 |
| 3,690,969 | 9/1972 | Hays et al....................... | 148/188 |
| 3,811,076 | 5/1974 | Smith.............................. | 357/53 X |
| 3,841,926 | 10/1974 | Garnache et al................ | 148/188 |
| 3,873,372 | 3/1975 | Johnson.......................... | 148/187 X |
| 3,887,993 | 6/1975 | Okada et al.................... | 357/23 X |
| 3,926,694 | 12/1975 | Cauge et al.................... | 357/23 X |

OTHER PUBLICATIONS

Barry et al., "Doped Oxides as Diffusion Sources" J. Electrochem. Soc., vol. 116, No. 6, June 1969, pp. 854–855.

*Primary Examiner*—L. Dewayne Rutledge
*Assistant Examiner*—W. G. Saba
*Attorney, Agent, or Firm*—Daniel E. Igo

[57] ABSTRACT

Disclosed is a method in the manufacture of FET single device memory cells and arrays for controlling a doped oxide diffusion profile and thereby controlling substrate diffusion and doped oxide diffusion source overlap and controlling the inherent formation of parasitic capacitance. This is accomplished by controlling the variation of four interrelated essential parameters in the production of a single device memory cell array with the consequent result of minimizing said parasitic capacitance encountered in certain overlap conditions and thereby maintaining and increasing device performance. Process conditions which are controlled relative to one another are the thickness of the doped oxide on a monocrystalline semiconductor silicon substrate, the amount of over etch carried out in the formation of a diffusion source island, the thickness of oxide formed on unprotected substrate areas during diffusion drive-in, and the depth of a particular diffusion into the substrate, known as $X_j$.

9 Claims, 11 Drawing Figures

DIFFUSION CONTROL FOR CONTROLLING PARASITIC CAPACITOR EFFECTS IN SINGLE FET STRUCTURE ARRAYS

BACKGROUND OF THE INVENTION

1. Field of the Invention

This invention pertains to a process for the formation of an integrated circuit structure, more particularly to the fabrication procedure associated with the manufacture of a single device memory cell incorporating field effect transistors (FET) a complete description of the type of device and a method of producing same is found in U.S. Pat. to Garnache et al. No. 3,841,926 issued Oct. 15, 1974. The invention especially relates to the profile of a doped oxide diffusion source in relation to the configuration of the actual diffusion and the control of parasitic capacitance.

As integrated circuit density has become greater and greater the problems of leakage currents and interference currents between adjacent integrated circuit devices has becomes more serious. Similarly the control of parasitic capacitance also becomes significant to maintain optimum operation of the device especially in FET memory arrays. It is to this latter aspect that the subject invention pertains.

Self alignment of various elements to fabricate semiconductor integrated circuits has been proposed and used for some time. The advantage of a self aligned structure is that the photolithographic alignment tolerances between certain critical levels on said circuit structures can be minimized thus obtaining a higher density of circuitry.

A problem which remains with present self aligned schemes is one of overlap parasitic capacitance caused by the very nature of the self aligned structure itself. This invention describes a method of fabricating a self aligning oxide diffusion structure which utilizes specific properties of the doped oxide diffusion source, the photolighography structure and the diffusion drive-in to fabricate a diffusion structure beneath the doped oxide source in a semiconductor body in which lateral extension of the edge of the diffusion can be tailored to reside out beyond the edge of the doped oxide pattern, entirely within the edges of said pattern or at points in between said limitations. The parasitic capacitance of this diffusion edge with other nearby structures can then be varied willfully, thus allowing it to become a circuit design parameter rather than a circuit design limitation.

Control of the overlap of the doped oxide source and the edge of the diffusion involves establishing the values of four independent parameters defined, explained and applied in this specification.

2. Description of the Prior Art

Prior teachings in the art relating to this invention pertain broadly to forming support layers on semiconductor wafers and removing portions of the semiconductor material so that separated semiconductor areas are exposed. Other disclosures are concerned with utilizing photoresist masks to form two or more individual patterns on semiconductor substrates with relatively high precision.

Likewise, the art is complete with teachings dealing with the formation of thermal oxides for masking purposes in the formation of active and passive integrated circuit elements. In bipolar technology high speed shallow junction transistor structures and processes are revealed wherein one or more low temperature oxide passivation layers are formed after the formation of a transistor base region and after the diffusion mask for the base region has been completely removed.

In general it can be said the art has taught the individual steps necessary to carrying out this invention but the sequence and control of a multiplicity of variables are new to the production of single device memory cells disclosed by this specification and the literature has not recognized the problem of parasitic capacitance resulting from the misalignment or overlap of the doped oxide or diffusion source where portions of this oxide remain on the substrate after diffusion into the substrate is complete.

SUMMARY OF THE INVENTION

Accordingly it is the object of this invention to provide a method whereby any parasitic capacitance condition that developes in the manufacture or otherwise fabrication of an integrated circuit device can be controlled.

It is another object of the invention to provide a method for the prevention of parasitic capacitance formation in a semiconductor single device memory cell having specific capacitance charge storage features.

Another object of this invention is to provide process control parameters for interrelated method steps whereby parasitic conditions will be minimized in the manufacture of a one device memory storage array.

These and other features of the invention will become more fully apparent from the ensuing detailed description and the accompanying drawings, however, broadly speaking the invention embraces the concept of following the described process steps so as to control and regulate the interrelation of the thickness of the doped oxide containing diffusion impurity material such as arsenic, phosphorus and the like, the level of the etch bias when the doped oxide structure is formed, the thickness of the dielectric formed on the unprotected area of the silicon substrate and the diffusion depth, $X_j$, during diffusion drive-in.

DESCRIPTION OF THE DRAWINGS

FIG. 3 is a sectional illustration of the substrate shown in FIG. 2 after a diffusion drive-in.

DESCRIPTION OF THE PREFERRED EMBODIMENT

In the manufacture of single device FET memory cells which are formed into arrays, it is well known to form the source and drain diffusions utilizing a doped oxide on one surface of a silicon substrate wafer and drive-in the imurity dopant contained in the oxide layer under oxidizing conditions at elevated temperatures. After drive-in the doped oxide can be completely removed or left remaining on the surface of the diffusion to serve other purposes in the ultimate device operation. This technique is used especially in the one device cell where a capacitor formed from one diffusion and the field shield is acting dually as a field shield and a capacitor plate. The technique is not limited to the formation of such a device but is applicable to any condition where a doped oxide impurity source is used to form a diffusion. However, the method often causes parasitic capacitance which adversely affects the operation of the device especially with respect to speed of operation, i.e. getting charge information in and out of the principle capacitor charge storage facility.

Figure 1:
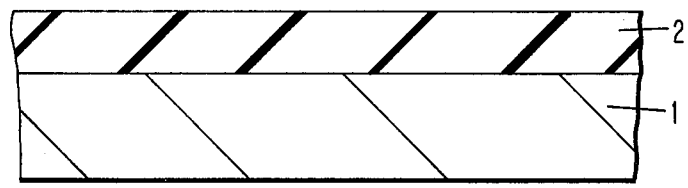
FIG. 1 is a cross-section of a semiconductor substrate having a layer of doped oxide thereon.
Figure 2:
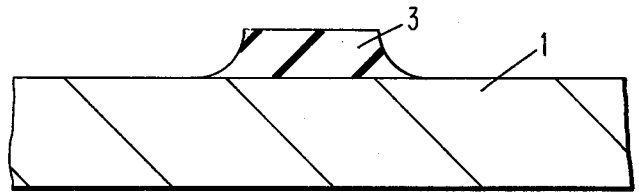
FIG. 2 is a section illustrating the substrate having a portion of the doped oxide removed and a portion left over an area where a substrate diffusion is to be made.

Referring now to the drawings FIG. 1 illustrates a silicon semiconductor substrate 1 having a layer of doped silicon dioxide 2 thereon. This layer is deposited by any known method. In this particular case the oxide contains an arsenic impurity which will form diffusions in the substrate deposited by any suitable method such as chemical vapor deposition. The arsenic content is calculated to be such an amount to be capable of forming a diffusion of the desired concentration. Using appropriate maskng techniques that portion of the doped silicon dioxide where diffusions are not desired is removed by etching with, for example, buffered HF or any other suitable etchant leaving a configuration illustrated in FIG. 2, where the substrate 1 will have superimposed thereon a multiplicity of doped oxide islands 3, which upon drive-in, usually in an oxidizing atmosphere in the presence of hydrogen chloride at about 1100°C forms a configuration as shown in FIG. 3.

Figure 3:
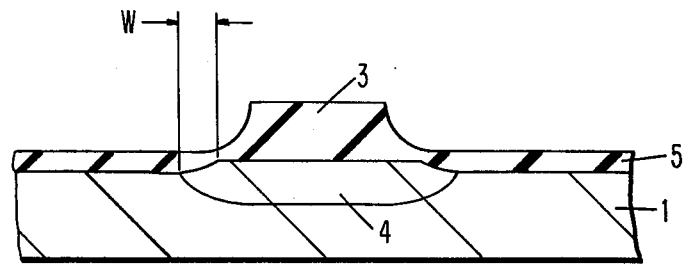

FIG. 3 illustrates the diffusion 4 and formation of a film of silicon dioxide in addition to the previously doped oxide 3. The diffusion, as shown, extends beyond the doped oxide diffusion impurity source and is illustrated by the width of the extension or overlap by the symbol W. The overlap W at this point is primarily a consequence of the thickness of the doped oxide source the etch bias during doped oxide island formation 3, and the lateral extension of the diffusion 4 from beneath the doped oxide island 3.

Figure 4:
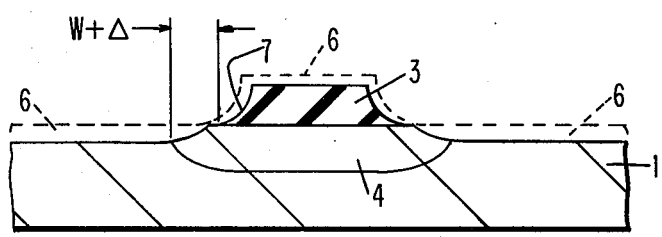
FIG. 4 is a sectional continuation showing the outward extension or overlap of the diffusion relative to the doped oxide or dopant source after removal of the drive-in oxide.
Figure 5:
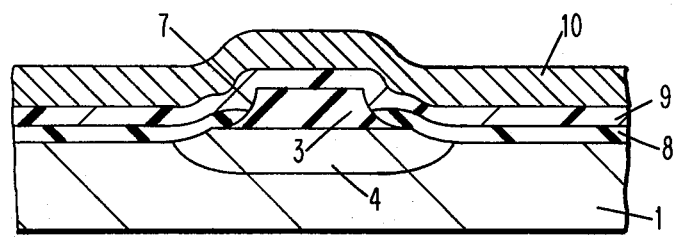
FIG. 5 is a continual section illustrating a dielectric oxide layer formed subsequent to the diffusion and a silicon nitride layer superimposed thereon and a final top conductive material film.
Figure 6:
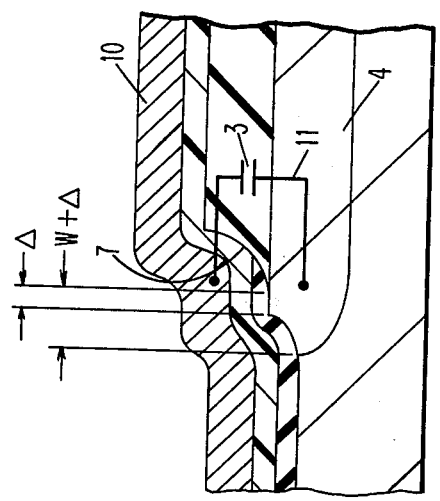
FIG. 6 is a partial section of the structure illustrated in FIG. 5 showing increased diffusion extensions relative to dopant source oxide.

The next sequential step is to etch away the oxide formed during the drive-in step and in so doing a portion of the doped oxide is also removed shown by the dotted line section in FIG. 4 and indicated by the numeral 6. Accordingly the oxide indicated as 5 in FIG. 3 is removed and in so doing a portion of the former doped oxide diffusion impurity source 3 is etched away in a configuration of an asymptotic type curve illustrated at 7 and thereby removing additional diffusion impurity source oxide to form the diffusion extention indicated as $W + \Delta$. The delta ($\Delta$) is determined by the amount of etching allowed to take place in removing the oxide layer indicated as 5 in FIG. 3. The silicon dioxide having been removed a composite layer of silicon dioxide and silicon nitride is deposited as shown at 8 and 9 in FIG. 5 with an overlay layer of conductive material indicated as 10. Therefore, the diffusion extention or overlay forms a capacitive condition illustrated in FIG. 6 where the diffusion and the conductive material are the respective capacitor plates and illustrated as 11 in FIG. 6. This capacitive condition is a condition formed in addition to the principle capacitor storage node normally associated with a single device FET cell having a capacitor connected in series with the FET structure. The additional capacitive condition is termed parasitic capacitance and is detrimental to the operation of the device. The extent of this detrimental effect is obvious to those skilled in the art. Nevertheless a slower speed device operation is one example of the phenomena. The conductive material layer or film could be silicon or a metal such as aluminum and the like.

Figure 7C:
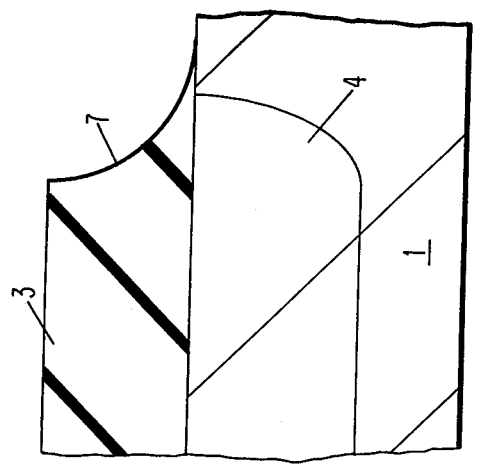
FIGS. 7A–C is a series of sectional illustrations demonstrating the various relationships between the diffusion and overlaying structures in a plus to minus configuration.
Figure 7B:
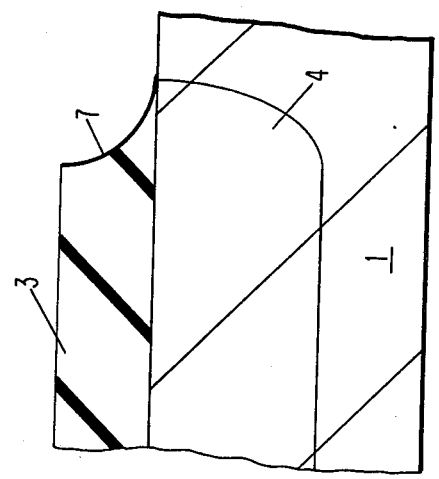
Figure 7A:
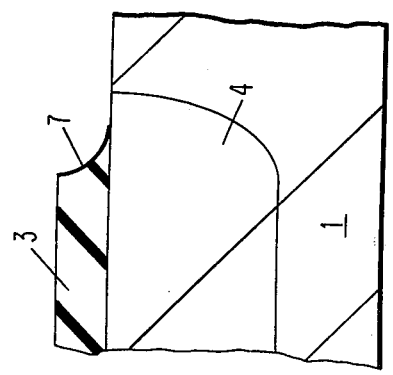
Figure 9:
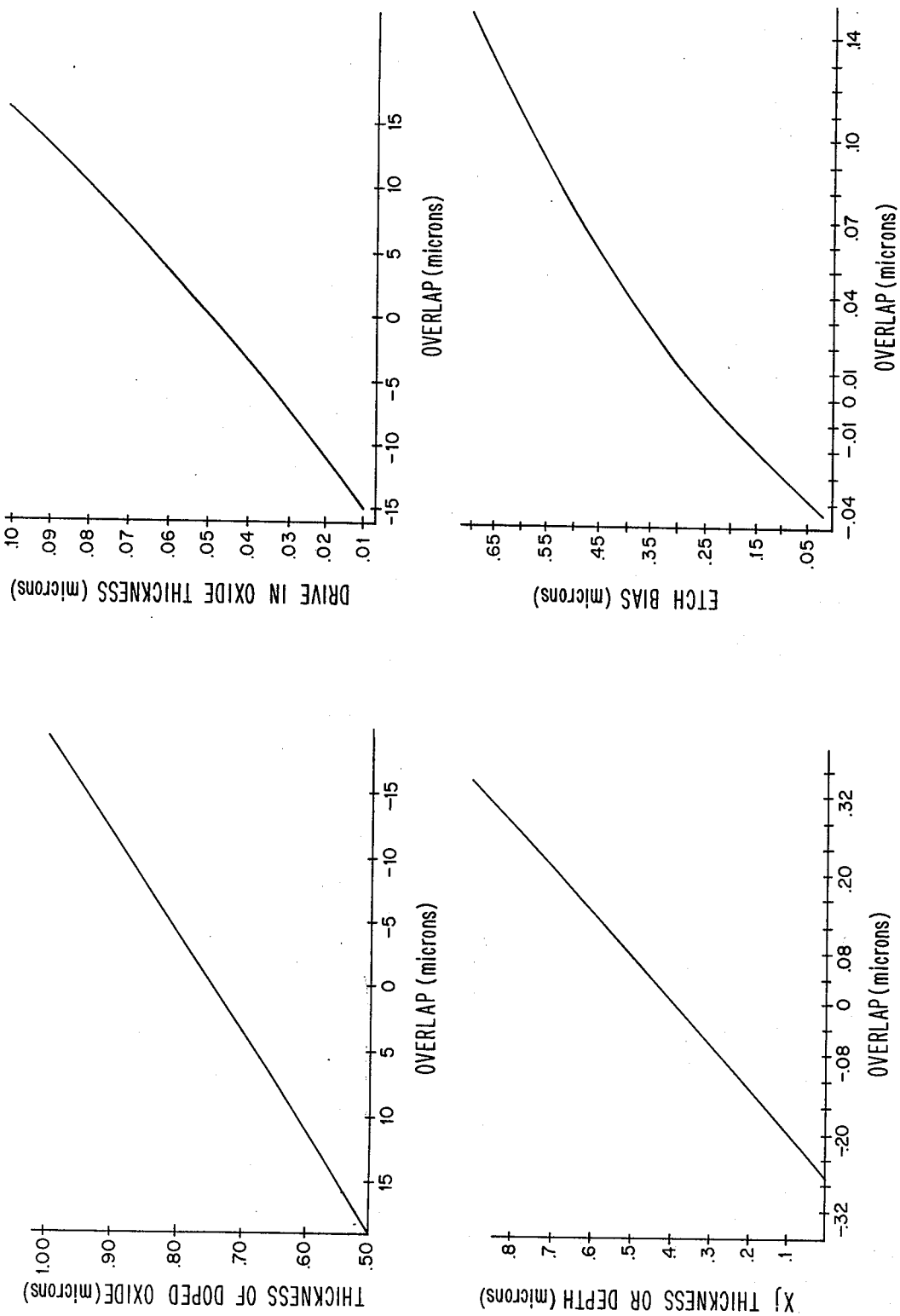
FIG. 9 is a series of plots illustrating the desired range of process control limitations controllable in accordance with this invention.

The principle objective obtained by this invention is to control the parasitic capacitance to a positive or negative state as shown in FIG. 7. If, for example, a single device cell memory array is being produced it would be desirable to have a configuration such as any desired distance from zero overlap in 7B to a minus overlap illustrated in 7C. The configuration illustrated in 7A could be desirable in, for example, self-supporting source follower circuit and could be termed a positive overlap.

The control of four principle variables in the csse of a doped silicon dioxide diffusion impurity source accomplishes the inventive result. These parameters or variables are the doped silicon dioxide thickness $T_{DO}$ in FIG. 8; the extent of the etch bias or the extent of etching undertaken to form the distance from the edge of the masking film to the edge of the doped oxide at the substrate or diffusion interface and which is characterized by $B_1$ in FIG. 8; thickness of oxide formed during the drive-in or diffusion process TDI in FIG. 8; and the diffusion depth $X_j$ illustrated in FIG. 8.

Figure 8:
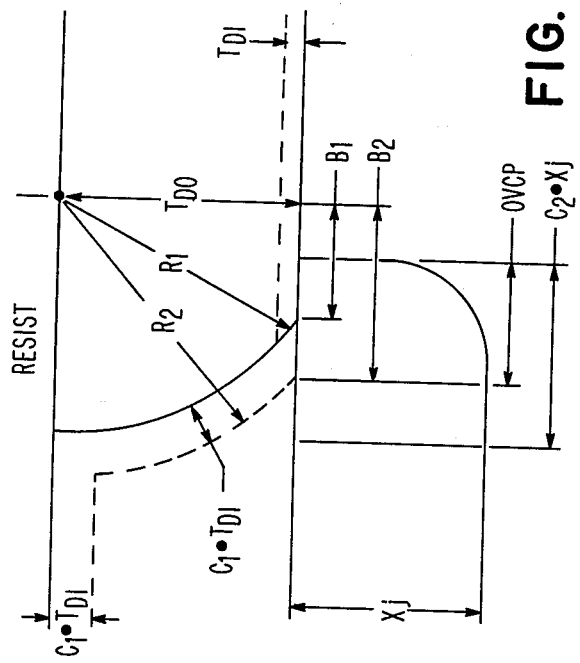
FIG. 8 is a partial section of the structure illustrated in FIG. 3 depicting the interrelated process variables and constants described below.

The control is accomplished in accordance with the following expression and further clarified by reference to FIG. 8 of the drawings.

$$O_{VLP} = C_2 \cdot X_j - R_1 + B_2$$

Where: $O_{VLP}$ = overlap either zero or plus or minus $$C_2 = \frac{\text{Lateral diffusion from top edge of doped oxide}}{\text{diffusion depth } (X_j)}$$

$X_j$ = diffusion depth $$R_1 = \sqrt{B_1^2 + T_{DO}^2}$$

with $B_1$ = etch bias
$T_{DO}$ = doped oxide thickness $$B_2 = \sqrt{R_2^2 - T_{DO}^2}$$

with $R_2 = R_1 + C_1 \cdot T_{DI}$ and $C_1 = \frac{\text{etch rate of doped oxide}}{\text{etch rate of drive-in oxide}}$ $T_{DI}$ = drive-in oxide thickness $C_1$ and $C_2$ are constants of the process The expression is applicable to an etch bias or overlap control of either plus or minus.

In a specific illustration of the invention one controllable parameter was varied and the others held constant using actual back up data and are illustrated by the following tables where all units are microns. Table I demonstrates the results when the thickness of the doped oxide diffusion impurity source is varied. Table II shows results where the thickness of the oxide formed during drive-in is varied. This is accomplished by anyone skilled in the art by control of the drive-in temperature and time. Table III illustrates results where $X_j$ or diffusion depth is varied and Table IV similarily shows results where etch bias is varied.

TABLE I

| Thickness of Doped Oxide ($\mu$m) | Etch Bias ($\mu$m) | Thickness of Drive-in Oxide ($\mu$m) | $X_j$ ($\mu$m) | Overlap ($\mu$m) |
| --- | --- | --- | --- | --- |
| .500 | .25 | .05 | .50 | .19 |
| .525 | .25 | .05 | .50 | .17 |
| .550 | .25 | .05 | .50 | .15 |
| .575 | .25 | .05 | .50 | .13 |
| .600 | .25 | .05 | .50 | .11 |
| .625 | .25 | .05 | .50 | .10 |
| .650 | .25 | .05 | .50 | .08 |
| .675 | .25 | .05 | .50 | .06 |
| .700 | .25 | .05 | .50 | .04 |
| .725 | .25 | .05 | .50 | .02 |
| .750 | .25 | .05 | .50 | .00 |
| .775 | .25 | .05 | .50 | -.02 |
| .800 | .25 | .05 | .50 | -.04 |
| .825 | .25 | .05 | .50 | -.06 |
| .850 | .25 | .05 | .50 | -.08 |
| .875 | .25 | .05 | .50 | -.10 |
| .900 | .25 | .05 | .50 | -.11 |
| .925 | .25 | .05 | .50 | -.13 |
| .950 | .25 | .05 | .50 | -.15 |
| .975 | .25 | .05 | .50 | -.17 |
| 1.000 | .25 | .05 | .50 | -.19 |

TABLE II

| Thickness of Doped Oxide | Etch Bias | Thickness of Drive-in Oxide | $X_j$ | Overlap |
| --- | --- | --- | --- | --- |
| .75 | .25 | .01 | .50 | -.15 |
| .75 | .25 | .02 | .50 | -.11 |
| .75 | .25 | .03 | .50 | -.07 |
| .75 | .25 | .04 | .50 | -.03 |
| .75 | .25 | .05 | .50 | .00 |
| .75 | .25 | .06 | .50 | .03 |
| .75 | .25 | .07 | .50 | .07 |
| .75 | .25 | .08 | .50 | .10 |
| .75 | .25 | .09 | .50 | .13 |
| .75 | .25 | .10 | .50 | .15 |

TABLE III

| Thickness of Doped Oxide | Etch Bias | Thickness of Drive-in Oxide | $X_j$ | Overlap |
| --- | --- | --- | --- | --- |
| .75 | .25 | 0.05 | .10 | -.27 |
| .75 | .25 | .05 | .15 | -.23 |
| .75 | .25 | .05 | .20 | -.20 |
| .75 | .25 | .05 | .25 | -.17 |
| .75 | .25 | .05 | .30 | -.13 |
| .75 | .25 | .05 | .35 | -.10 |
| .75 | .25 | .05 | .40 | -.06 |
| .75 | .25 | .05 | .45 | -.03 |
| .75 | .25 | .05 | .50 | .00 |
| .75 | .25 | .05 | .55 | .04 |
| .75 | .25 | .05 | .60 | .07 |
| .75 | .25 | .05 | .65 | .10 |
| .75 | .25 | .05 | .70 | .14 |
| .75 | .25 | .05 | .75 | .17 |
| .75 | .25 | .05 | .80 | .20 |
| .75 | .25 | .05 | .85 | .24 |
| .75 | .25 | .05 | .90 | .27 |
| .75 | .25 | .05 | .95 | .30 |
| .75 | .25 | .05 | 1.00 | .34 |

TABLE IV

| Thickness of Doped Oxide | Etch Bias | Thickness of Drive-in Oxide | $X_j$ | Overlap |
| --- | --- | --- | --- | --- |
| .75 | .00 | .05 | .50 | -.04 |
| .75 | .05 | .05 | .50 | -.04 |
| .75 | .10 | .05 | .50 | -.03 |
| .75 | .15 | .05 | .50 | -.02 |
| .75 | .20 | .05 | .50 | -.01 |
| .75 | .25 | .05 | .50 | .00 |
| .75 | .30 | .05 | .50 | .02 |
| .75 | .35 | .05 | .50 | .03 |
| .75 | .40 | .05 | .50 | .05 |
| .75 | .45 | .05 | .50 | .06 |
| .75 | .50 | .05 | .50 | .08 |
| .75 | .55 | .05 | .50 | .09 |
| .75 | .60 | .05 | .50 | .11 |
| .75 | .65 | .05 | .50 | .12 |
| .75 | .70 | .05 | .50 | .13 |
| .75 | .75 | .05 | .50 | .14 |

While the invention has been particularly shown and described with reference to a preferred embodiment thereof, it will be understood by those skilled in the art that various changes in form and details may be made therein without departing from the spirit and scope of the invention. For example, the parameters controlled are not limited to a Field Effect Transistor having connected thereto a capacitor for charge storage but is useful in any capacity where diffusion overlap control is desired or is significant.

What is claimed is:

1. A method for the manufacture of semiconductor devices wherein impurity diffusions are formed into selected areas of a semiconductor substrate from an overlaying material on partial areas of said substrate and containing said impurity the improvement comprising adjusting in relation to each other the thickness of said material containing said impurity; the extent to which said selected areas formed from the completely covered substrate are etched; the thickness of material formed on the non-selected areas during the diffusion; and the depth of said diffusion in said substrate, wherein the relationship of adjusting conditions is relative pursuant to the following expression:

$$O_{VLP} = C_2 \cdot X_j - R_1 = B_2$$

Where: $O_{VLP}$ = overlap either zero or plus or minus $$C_2 = \frac{\text{lateral diffusion from top edge of doped oxide}}{\text{diffusion depth } (X_j)}$$

$X_j$ = diffusion depth $$R_1 = \sqrt{B_1^2 + T_{DO}^2}$$

with $B_1$ = etch bias
$T_{DO}$ = doped oxide thickness $$B_2 = \sqrt{R_2^2 - T_{DO}^2}$$

with $R_2 = R_1 + C_1 \cdot T_{DI}$ $$\text{and } C_1 = \frac{\text{etch rate of doped oxide}}{\text{etch rate of drive-in oxide}}$$

$T_{DI}$ = drive-in oxide thickness $C_1$ and $C_2$ are constants of the process 2. A method in accordance with claim 1 wherein said device formed is a field effect transistor serially connected to a capacitor.

3. A method in accordance with claim 1 wherein said substrate is monocrystalline silicon and the impurity containing material is silicon dioxide.

4. A method in accordance with claim 1 wherein said impurity is arsenic or phosphorus.

5. A method in accordance with claim 1 wherein said devices are formed in an array configuration.

6. A method in accordance with claim 1 wherein the entire substrate is covered with a material containing a dopant impurity and where the thickness of said material and the extent of selectively removing said material by etching to a silicon substrate are relative to each other and to the thickness of material formed during diffusion drive-in and the depth of said diffusion.

7. A method in accordance with claim 1 wherein said substrate is monocrystalline silicon.

8. A method in accordance with claim 1 wherein said material containing dopant is deposited upon said substrate by means of chemical vapor deposition.

9. A method in accordance with claim 1 wherein said diffusion of dopant impurity into selected areas of a substrate is carried out on a monocrystalline silicon semiconductor wafer in an oxidizing atmosphere whereby a specific amount of silicon dioxide is formed on areas where diffusion is not accomplished.

* * * * *

UNITED STATES PATENT OFFICE
CERTIFICATE OF CORRECTION

PATENT NO. : 3,975,220
DATED : August 17, 1976
INVENTOR(S) : R. M. Quinn et. al.

It is certified that error appears in the above–identified patent and that said Letters Patent are hereby corrected as shown below:

In the Title:

Before "DIFFUSION" insert --METHOD OF--

In the Specification:

Column 4, line 33    Delete "csse" and insert --case--.

In the Claims:

Column 6, line 50    Delete "$O_{VLP} = C_2 \cdot X_j - R_1 = B_2$" and substitute therefor,
--$O_{VLP} = C_2 \cdot X_j - R_1 + B_2$--.

Signed and Sealed this

Eleventh Day of March 1980

[SEAL]

Attest:

SIDNEY A. DIAMOND

*Attesting Officer*    *Commissioner of Patents and Trademarks*